(12) United States Patent
Hirose et al.

(10) Patent No.: US 7,323,376 B2
(45) Date of Patent: Jan. 29, 2008

(54) METHOD FOR FABRICATING A SEMICONDUCTOR DEVICE INCLUDING A GROUP III NITRIDE SEMICONDUCTOR

(75) Inventors: Yutaka Hirose, Kyoto (JP); Yoshito Ikeda, Osaka (JP); Kaoru Inoue, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/736,605

(22) Filed: Dec. 17, 2003

(65) Prior Publication Data

US 2004/0227153 A1 Nov. 18, 2004

(30) Foreign Application Priority Data

Jan. 22, 2003 (JP) .............................. 2003-013395

(51) Int. Cl.
*H01L 21/338* (2006.01)

(52) U.S. Cl. ................ 438/167; 438/570; 257/E29.317

(58) Field of Classification Search ............ 438/46–47, 438/92–94, 167, 172, 570, 604, 606, 718, 438/181, 197, 287; 257/267, 280, 281, E29.317
See application file for complete search history.

(56) References Cited

U.S. PATENT DOCUMENTS

| | | | | |
|---|---|---|---|---|
| 5,358,666 A | * | 10/1994 | Sasaki | .......................... 252/512 |
| 6,057,564 A | | 5/2000 | Rennie | |
| 6,297,538 B1 | * | 10/2001 | Kolodzey et al. | ............ 257/410 |

FOREIGN PATENT DOCUMENTS

| | | | |
|---|---|---|---|
| JP | 2-119145 | | 5/1990 |
| JP | 7-297206 | * | 11/1995 |
| JP | 10-223901 | | 8/1998 |
| JP | 11-54798 | | 2/1999 |
| JP | 2000-174285 | | 3/2000 |
| JP | 2000-150792 | | 5/2000 |
| JP | 2001-156081 | | 6/2001 |
| JP | 2002-246589 | | 8/2002 |
| JP | 2002-329863 | | 11/2002 |

OTHER PUBLICATIONS

Liu et al., "Ni and Ni silicide Schottky contacts on n-GaN", Journal of Applied Physics, vol. 84, No. 2, pp. 881-886, Jul. 15, 1998.*
Hashizume, T., et al. "Characterization of GaN and AlGaN Surfaces and Their Insulated Gate Structures." The Institute of Electronics, Information and Communication Engineers. Technical Report of IEICE., ED2002-87, LQE2002-62 (Jun. 2002). pp. 57-60, Jun. 14, 2002.
Kusunoki, S., et al. "Hot-Carrier-Resistant Structure by Re-oxidized Nitrided Oxide Sidewall for Highly Reliable and High Performance LDD MOSFETS.", IEEE, IEDM 91, 25.4.1-25.4.4, pp. 349-652, 1991.
Japanese Office Action issued in Japanese Patent Application No. 2003-409516 dated Oct. 16, 2007.

* cited by examiner

*Primary Examiner*—Thien F Tran
(74) *Attorney, Agent, or Firm*—McDermott Will & Emery LLP

(57) ABSTRACT

A semiconductor device has a Group III nitride semiconductor layer and a gate electrode formed on the Group III nitride semiconductor layer. The gate electrode contains an adhesion enhancing element. A thermally oxidized insulating film is interposed between the Group III nitride semiconductor layer and the gate electrode.

8 Claims, 12 Drawing Sheets

METHOD FOR FABRICATING A SEMICONDUCTOR DEVICE INCLUDING A GROUP III NITRIDE SEMICONDUCTOR

BACKGROUND OF THE INVENTION

The present invention relates to a semiconductor device composed of a Group III nitride semiconductor layer typically represented by $(In_xAl_{1-x})_yGa_{1-y}N$ ($0 \leq x \leq 1$, $0 \leq y \leq 1$), i.e., a so-called gallium-nitride-based compound semiconductor layer and to a method for fabricating the same.

Studies have been made on the application of a Group III nitride semiconductor, i.e., a semiconductor composed of GaN, AlN, InN, or a mixed crystal thereof not only to a short-wavelength light-emitting device but also to an electronic device. In particular, the development of a heterojunction field effect transistor (HFET) device using a high-density 2-D electron gas formed at the heterojunction interface between $Al_xGa_{1-x}N$ ($0 \leq x \leq 1$) and GaN as a high-output RF device has been pursued because of its high dielectric breakdown voltage and high saturation speed and its high possibility of allowing full use of these advantageous physical properties inherent in a nitride semiconductor.

Referring to FIG. 13, a conventional semiconductor device having a Group III nitride semiconductor layer will be described herein below.

As shown in FIG. 13, a buffer layer 102 is formed on a substrate 101 and a GaN layer 103 is formed on the buffer layer 102. An $Al_xGa_{1-x}N$ layer 104 is formed on the GaN layer 103. Ohmic contacts 105 are formed in the $Al_xGa_{1-x}N$ layer 104 and a gate electrode 106 is formed on the $Al_xGa_{1-x}N$ layer 104.

In a HFET, the flow rate of a 2-D electron gas flowing in the channel region is normally controlled by adjusting a voltage applied to the gate electrode 106 forming a Schottky junction with the surface barrier layer of the $Al_xGa_{1-x}N$ layer 104. Thus, the gate electrode having the Schottky junction formed on the surface of the nitride semiconductor layer is typically formed by depositing a metal gate electrode material directly on the surface of the nitride semiconductor layer. In this case, the reactivity between the gate electrode material and the nitride semiconductor layer should be increased to provide enhanced adhesion therebetween.

However, the increased reactivity between the gate electrode material and the nitride semiconductor layer presents a serious problem in minimizing a leakage characteristic at the Schottky junction formed finally. To minimize a leakage current, a material low in the reactivity (e.g., Au, Pt, Pd, or the like) to the nitride semiconductor layer may be used normally appropriately for the gate electrode. However, the gate electrode using the material low in reactivity is easily delaminated from the surface of the nitride semiconductor layer because it is low in the reactivity to the nitride semiconductor layer and therefore low in the adhesion to the surface of the nitride semiconductor layer.

To solve the problem of easy delamination of the gate electrode using a material low in the reactivity to the nitride semiconductor layer such as Au, Pt, or Pd, a method which enhances the adhesion of the gate electrode to the nitride semiconductor layer by vapor depositing Ti, Ni, Si, or the like in conjunction with Au, Pt, Pd, or the like has been adopted normally.

However, since Ti, Ni, or Si is a metal high in the reactivity to the nitride semiconductor layer, it chemically reacts with the nitride semiconductor layer to induce a defect such as a nitrogen void in the nitride semiconductor layer. Consequently, a leakage current flowing through the formed Schottky junction is increased significantly.

It has been proved that the adhesion of the gate electrode to the nitride semiconductor layer is enhanced by using Pd containing an extremely small amount of Si to form the gate electrode on the surface of the nitride semiconductor layer for the purpose of forming a Schottky junction which allows a reduction in the occurrence of a leakage current. If the amount of Si added to the material of the gate electrode is minimized, however, the need to suppress an effect of mechanical disturbance in the process of fabricating a semiconductor device after the formation of the gate electrode (e.g., the avoidance of excessive ultrasonic cleaning) grows enormously. In addition, the minimized amount of Si added to the material of the gate electrode mostly causes a new problem of delamination of the gate electrode that has once adhered to the surface of the nitride semiconductor layer if the gate electrode is formed on an epitaxial layer having an extremely rough surface and insufficient crystallinity or if a high-temperature heat treatment process is performed.

SUMMARY OF THE INVENTION

In view of the foregoing, it is therefore an object of the present invention to minimize a leakage current flowing through a Schottky junction and enhance the adhesion of a gate electrode to a nitride semiconductor layer.

To attain the object, a semiconductor device according to the present invention comprises: a Group III nitride semiconductor layer; and a gate electrode formed on the Group III nitride semiconductor layer, the gate electrode containing an adhesion enhancing element, a thermally oxidized insulating film being interposed between the Group III nitride semiconductor layer and the gate electrode.

In the semiconductor device according to the present invention, the thermally oxidized insulating film is interposed between the gate electrode and the Group III nitride semiconductor layer so that the gate electrode undergoes a chemical reaction with the thermally oxidized insulating film but does not undergo a direct chemical reaction with the Group III nitride semiconductor layer. Consequently, the occurrence of a leakage current is suppressed. Because the gate electrode undergoes a chemical reaction with the thermally oxidized insulating film but does not undergo a direct chemical reaction with the Group III nitride semiconductor layer, the content of the adhesion enhancing element in the gate electrode can be increased to a required value. This enhances the adhesion of the gate electrode to the nitride semiconductor layer and prevents the delamination of the gate electrode due to an external factor.

The adhesion enhancing element is an element which enhances the adhesion of the gate electrode to the nitride semiconductor layer. Preferably, the adhesion enhancing element is a highly oxidizable element such as Ti, Si, Ni, Cr, Cu, Al, Hf, Zr, Nb, Ta, Nd, Ga, or In. The thermally oxidized insulating film conceptually includes a genuine thermal oxide film and a thermal oxide film containing nitrogen, i.e., a thermal oxynitride insulating film.

In the semiconductor device according to the present invention, if the thermally oxidized insulating film is composed of an aluminum oxide or a silicon oxide, the gate electrode undergoes a chemical reaction with the thermally oxidized insulating film but does not undergo a direct chemical reaction with the Group III nitride semiconductor layer so that the occurrence of a leakage current is suppressed reliably. Since the adhesion of the gate electrode to the nitride semiconductor layer is enhanced, the delamination of the gate electrode due to an external factor can be prevented more reliably.

In the semiconductor device according to the present invention, the thermally oxidized insulating film preferably has a thickness not less than 0.5 nm and not more than 3 nm.

In the arrangement, if the thickness of the thermally oxidized insulating film is less than 0.5 nm, the occurrence of a leakage current cannot be suppressed in the same manner as in the case where the gate electrode is bonded directly onto the Group III nitride semiconductor layer. If the thickness of the thermally oxidized insulating film is larger than 3 nm, the thermally oxidized insulating film develops the function as the insulating film and a Schottky junction cannot be formed. By limiting the thickness of the thermally oxidized insulating film to a range not less than 0.5 nm and not more than 3 nm, therefore, a Schottky junction can be formed and the occurrence of a leakage current can be suppressed to a small value, while the adhesion of the gate electrode to the nitride semiconductor layer can be enhanced.

In the semiconductor device according to the present invention, the gate electrode preferably contains Pd.

The arrangement effectively suppresses the occurrence of a leakage current and enhances the adhesion to the thermally oxidized insulating film. In addition, the gate electrode containing Pd shows a high resistance to heat.

In the semiconductor device according to the present invention, if the adhesion enhancing element is Ti, Ni, or Si, the adhesion of the gate electrode to the nitride semiconductor layer is enhanced.

In the semiconductor device according to the present invention, if the adhesion enhancing element is a highly oxidizable element, the adhesion of the gate electrode to the nitride semiconductor layer is enhanced.

In the semiconductor device according to the present invention, the thermally oxidized insulating film is preferably an insulating film obtained by thermally oxidizing the Group III nitride semiconductor layer.

In the semiconductor device according to the present invention, the adhesion enhancing element is preferably Si and a weight percent of the Si in metals composing the gate electrode is preferably not less than 3% and not more than 10%.

In the arrangement, the delamination of the gate electrode is not observed at all or seldom observed throughout the entire surface of the wafer so that the gate electrode has an excellent adhesion to the nitride semiconductor layer. In this case, it is also possible to suppress the leakage current to an extremely small value or to a small value so that the gate electrode has excellent electric characteristics.

In the semiconductor device according to the present invention, the adhesion enhancing element is preferably Si and a weight percent of the Si in metals composing the gate electrode is more preferably not less than 4% and not more than 7%.

In the arrangement, the delamination of the gate electrode is not observed at all throughout the entire surface of the wafer so that the gate electrode has an excellent adhesion to the nitride semiconductor layer. In this case, it is also possible to suppress the leakage current to an extremely small value so that the gate electrode has excellent electric characteristics.

To attain the foregoing object, a method for fabricating a semiconductor device according to the present invention comprises the steps of: thermally oxidizing a Group III nitride semiconductor layer to form a thermally oxidized insulating film on a surface of the Group III nitride semiconductor layer; and forming a gate electrode containing an adhesion enhancing element on the thermally oxidized insulating film.

In accordance with the method for fabricating a semiconductor device according to the present invention, the thermally oxidized insulating film is interposed between the gate electrode and the Group III nitride semiconductor layer so that the gate electrode undergoes a chemical reaction with the thermally oxidized insulating film but does not undergo a direct chemical reaction with the Group III nitride semiconductor layer. Consequently, the occurrence of a leakage current is suppressed. Because the gate electrode undergoes a chemical reaction with the thermally oxidized insulating film but does not undergo a direct chemical reaction with the Group III nitride semiconductor layer, the content of the adhesion enhancing element in the gate electrode can be increased to a required value. This enhances the adhesion of the gate electrode to the nitride semiconductor layer and prevents the delamination of the gate electrode due to an external factor.

The adhesion enhancing element is an element which enhances the adhesion of the gate electrode to the nitride semiconductor layer. Preferably, an adhesion enhancing element is a highly oxidizable element such as Ti, Si, Ni, Cr, Cu, Al, Hf, Zr, Nb, Ta, Nd, Ga, or In. The thermally oxidized insulating film conceptually includes a genuine thermal oxide film and a thermal oxide film containing nitrogen, i.e., a thermal oxynitride insulating film.

In the method for fabricating a semiconductor device according to the present invention, the step of forming the thermally oxidized insulating film preferably includes the step of: forming an aluminum nitride layer on the Group III nitride semiconductor layer and then thermally oxidizing the aluminum nitride layer to change the aluminum nitride layer into an aluminum oxide layer and thereby form the thermally oxidized insulating film composed of the aluminum oxide layer.

In the arrangement, the aluminum oxide layer is interposed between the gate electrode and the aluminum nitride layer so that the gate electrode undergoes a chemical reaction with the aluminum oxide layer but does not undergo a direct chemical reaction with the aluminum nitride layer. Consequently, the occurrence of a leakage current is suppressed. Because the gate electrode undergoes a chemical reaction with the aluminum oxide layer but does not undergo a direct chemical reaction with the aluminum nitride layer, the content of the adhesion enhancing element in the gate electrode can be increased to a required value. This enhances the adhesion of the gate electrode to the nitride semiconductor layer and prevents the delamination of the gate electrode due to an external factor.

In the method for fabricating a semiconductor device according to the present invention, the aluminum oxide layer preferably has a thickness not less than 0.5 nm and not more than 3 nm.

In the arrangement, if the thickness of the aluminum oxide layer is less than 0.5 nm, the occurrence of a leakage current cannot be suppressed in the same manner as in the case where the gate electrode is bonded directly onto the Group III nitride semiconductor layer. If the thickness of the aluminum oxide layer is larger than 3 nm, the aluminum oxide layer develops the function as the insulating film and a Schottky junction cannot be formed. By limiting the thickness of the aluminum oxide layer to a range not less than 0.5 nm and not more than 3 nm, therefore, a Schottky junction can be formed and the occurrence of a leakage current can be suppressed to a small value, while the adhesion of the gate electrode to the nitride semiconductor layer can be enhanced.

In the method for fabricating a semiconductor device according to the present invention, the step of forming the thermally oxidized insulating film preferably includes the step of: forming a silicon layer on the surface of the Group III nitride semiconductor layer and then thermally oxidizing the silicon layer to change the silicon layer into a silicon oxide layer and thereby form the thermally oxidized insulating film composed of the silicon oxide layer.

In the arrangement, the silicon oxide layer is interposed between the gate electrode and the nitride semiconductor layer so that the gate electrode undergoes a chemical reaction with the silicon oxide layer but does not undergo a direct chemical reaction with the Group III silicon semiconductor layer. Consequently, the occurrence of a leakage current is suppressed. Because the gate electrode undergoes a chemical reaction with the silicon oxide layer but does not undergo a direct chemical reaction with the group III nitride semiconductor layer, the content of the adhesion enhancing element in the gate electrode can be increased to a required value. This enhances the adhesion of the gate electrode to the nitride semiconductor layer and prevents the delamination of the gate electrode due to an external factor.

In the method for fabricating a semiconductor device according to the present invention, the silicon oxide layer preferably has a thickness not less than 0.5 nm and not more than 3 nm.

In the arrangement, if the thickness of the silicon oxide layer is less than 0.5 nm, the occurrence of a leakage current cannot be suppressed in the same manner as in the case where the gate electrode is bonded directly onto the Group III nitride semiconductor layer. If the thickness of the silicon oxide layer is larger than 3 nm, the silicon oxide layer develops the function as the insulating film and a Schottky junction cannot be formed. By limiting the thickness of the silicon oxide layer to a range not less than 0.5 nm and not more than 3 nm, therefore, a Schottky junction can be formed and the occurrence of a leakage current can be suppressed to a small value, while the adhesion of the gate electrode to the nitride semiconductor layer can be enhanced.

DETAILED DESCRIPTION OF THE INVENTION

Embodiment 1

A semiconductor device according to a first embodiment of the present invention and a fabrication method therefor will be described herein below with reference to FIGS. 1A to 1C and FIG. 2.

Figure 1A:
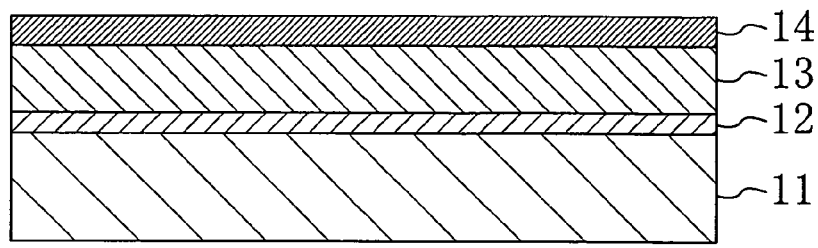
FIGS. 1A to 1C are cross-sectional views showing process steps in a method for fabricating a semiconductor device according to a first embodiment of the present invention.
Figure 1B:
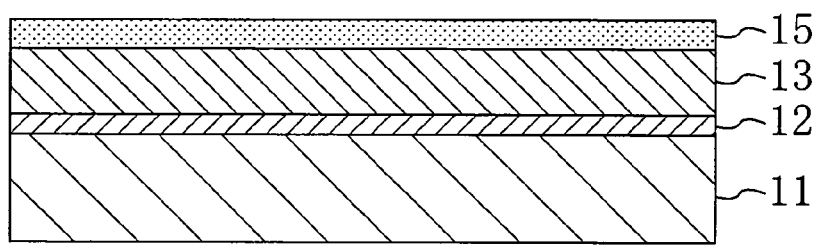
Figure 1C:
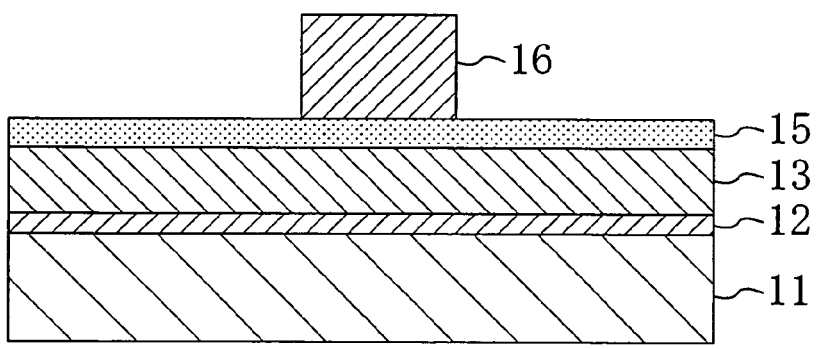

FIGS. 1A to 1C are cross-sectional views showing process steps in the method for fabricating the semiconductor device according to the first embodiment.

First, as shown in FIG. 1A, a buffer layer 12 is deposited on a SiC substrate 11. Then, an n$^-$-type GaN layer 13 is formed on the buffer layer 12 by metal organic chemical vapor deposition (MOCVD) or molecular beam epitaxy (MBE). Subsequently, an AlN layer 14 with an extremely small thickness of 1.5 nm is formed similarly on the GaN layer 13 by MOCVD or MBE.

Next, as shown in FIG. 1B, a thermally oxidized insulating film is formed by oxidizing the surface of a sample shown in FIG. 1A in an oxygen atmosphere at 900° C. for 5 minutes, in which an oxygen flow rate is 5 mL/min (standard state). As a result, the AlN layer 14 formed on the GaN layer 13 is thermally oxidized and changed into an extremely thin $Al_2O_3$ film (thermally oxidized insulating film) 15.

Next, as shown in FIG. 1C, Pd containing 10 wt % of Si as an adhesion enhancing element is vapor deposited on the $Al_2O_3$ film 15 and subjected to a lift-off process to form a gate electrode 16 composed of Pd containing 10 wt % of Si, whereby a diode is completed.

A description will be given to the adhesion enhancing element with reference to Table 1.

The adhesion enhancing element is an element which enhances the adhesion of the gate electrode to the nitride semiconductor layer. As shown in the following Table 1, an element having high adhesion such as Ti, Si, Ni, Cr, or Cu can be used as the adhesion enhancing element.

TABLE 1

|    | Adhesion | Leakage |
| --- | --- | --- |
| Ti | High | — |
| Si | High | — |
| Ni | High | — |
| Cr | High | — |
| Pt | Low | Small |
| Au | Low | Small |
| Pd | Low | Small |
| Cu | High | Small |

Preferably, the adhesion enhancing element is a highly oxidizable element. This is because a gate electrode containing a highly oxidizable element is excellent in the adhesion to the nitride semiconductor layer.

Table 2 shows the oxides of metal elements and Si, the oxidizabilities thereof, and heats generated by oxidation.

TABLE 2

|    | Oxide | Oxidizability | Heat Generated by Oxidation (kJ/mol) |
| --- | --- | --- | --- |
| Al | $Al_2O_3$ | High | 1675.7 |
| Hf | $HfO_2$ | High | 1117.5 |
| Zr | $ZrO_2$ | High | 1100.8 |
| Nb | $Nb_2O_5$ | High | 1899.5 |
| Ta | $Ta_2O_5$ | High | 2046.4 |
| Nd | $Nd_2O_3$ | High | 1808.3 |
| Si | $SiO_2$ | High | 910.9 |
| Ga | $Ga_2O_3$ | High | 1089.1 |
| In | $In_2O_3$ | High | 925.9 |
| Au | $Au_2O_3$ | Low | 3.4 |
| Pd | PdO | Low | 115 |
| Pt | No Solid Oxide | Low | — |

As shown in Table 2, Al, Hf, Zr, Nb, Ta, Nd, Si, Ga, and In have high values as the heats generated by oxidation and the high oxidizabilities thereof are obvious. Thus, Al, Hf, Zr, Nb, Ta, Nd, Si, Ga, and In are easily oxidized to form $Al_2O_3$, $HfO_2$, $ZrO_2$, $Nb_2O_5$, $Ta_2O_5$, $Nd_2O_3$, $SiO_2$, $Ga_2O_3$, and $In_2O_3$. By contrast, it will be understood that each of Au, Pd, and Pt is low in oxidizability and inappropriate as an adhesion enhancing element. Hence, it is desirable to use any of Al, Hf, Zr, Nb, Ta, Nd, Si, Ga, and In as an adhesion enhancing element as shown in Table 2.

Preferably, the $Al_2O_3$ film 15 formed between the gate electrode 16 and the GaN layer 13 has a thickness not less than 0.5 nm and not more than 3 nm.

Table 3 shows the thicknesses of the $Al_2O_3$ film 15 and a relationship between the thickness of the $Al_2O_3$ film 15 and each of the Schottky characteristic of the gate electrode 16 formed on the $Al_2O_3$ film 15 and the surface morphology of the $Al_2O_3$ film 15.

TABLE 3

|    | Thickness of $Al_2O_3$ Film (nm) | | | | | | |
| --- | --- | --- | --- | --- | --- | --- | --- |
|    | 0.2 | 0.5 | 1.0 | 1.5 | 2.0 | 2.5 | 3.0 |
| Schottky Characteristic | — | ○ | ○ | ○ | ○ | ○ | Δ |
| Surface Morphology of $Al_2O_3$ Film | — | ○ | ○ | ○ | ○ | ○ | Δ |

○: Good
Δ: Acceptable

As is obvious from Table 3, the Schottky characteristic is good when the thickness of the $Al_2O_3$ film 15 is not less than 0.5 m and not more than 3 nm. This is because a leakage current cannot be suppressed if the film thickness is less than 0.5 nm in the same manner as in the case where the gate electrode 16 is bonded directly onto the GaN layer 13, while the $Al_2O_3$ film 15 develops the function as an insulating film if the thickness of the $Al_2O_3$ film 15 is larger than 3 nm and therefore a Schottky junction cannot be formed. In short, a good Schottky characteristic is achievable and the function of the gate electrode is not impaired if the thickness of the $Al_2O_3$ film 15 is not less than 0.5 nm and not more than 3 nm. It will also be understood that the surface morphology of the $Al_2O_3$ film 15 is also good if the thickness of the $Al_2O_3$ film 15 is not less than 0.5 nm and not more than 3 nm. However, the Schottky characteristic is better and a leakage current can be suppressed more effectively if the thickness of the $Al_2O_3$ film 15 is 0.8 nm to 3 nm, more preferably.

Thus, in the semiconductor device according to the first embodiment and the fabrication method therefor, the $Al_2O_3$ film 15 is interposed between the gate electrode 16 and the GaN layer 13 so that the gate electrode 16 undergoes a chemical reaction with the $Al_2O_3$ film 15 but does not undergo a direct chemical reaction with the GaN layer 13. Consequently, the occurrence of a leakage current is suppressed. Because the gate electrode 16 undergoes a chemical reaction with the $Al_2O_3$ film 15 but does not undergo a direct chemical reaction with the GaN layer 13, the content of Si mixed in the gate electrode 16 can be increased to a required value. This enhances the adhesion of the gate electrode to the nitride semiconductor layer and prevents the delamination of the gate electrode 16 due to an external factor. As a result, the delamination of the gate electrode 16 was not observed at all even when excessive ultrasonic cleaning was performed during the lift-off process in the formation of the gate electrode 16. Thus, the semiconductor device according to the first embodiment and the fabrication method therefor realize an extremely low leakage characteristic inherent in Pd composing the gate electrode 16 and prevent the delamination of the gate electrode 16.

Since the $Al_2O_3$ film 15 interposed between the gate electrode 16 and the GaN layer 13 is a thermally oxidized insulating film, a surface level resulting from a dangling bond or the like is low so that electric stability is obtainable in forming the thermally oxidized insulating film. Accordingly, the thermally oxidized insulating film interposed between the gate electrode 16 and the GaN layer 13 prevents a leakage current caused by the electrical activation of the majority of the surface level resulting from the dangling bond or the like provided that it is an insulating film deposited normally by CVD or the like.

Figure 2:
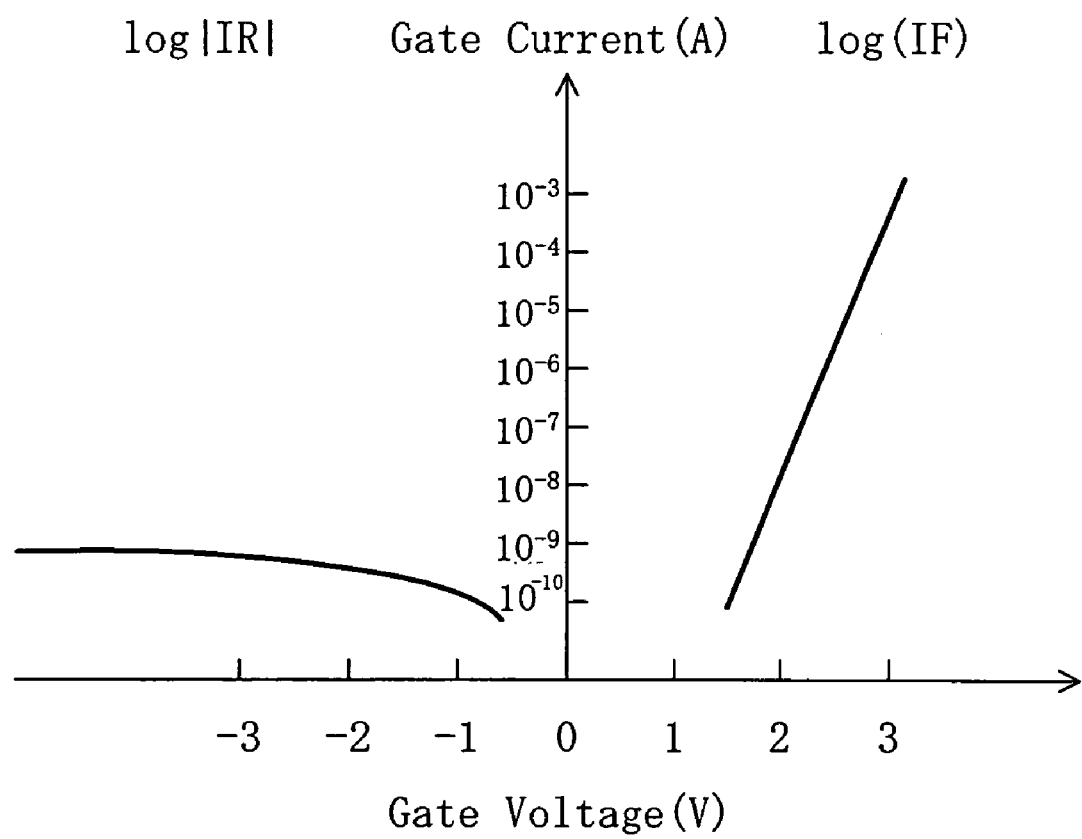
FIG. 2 is a graph showing the I-V characteristic of a gate electrode according to the first embodiment.

FIG. 2 shows the I-V characteristic of the gate electrode 16 according to the first embodiment. As is obvious from FIG. 2, the semiconductor device according to the first embodiment has an excellent Schottky characteristic.

It is to be noted that the thermally oxidized insulating film used in the first embodiment conceptually includes a genuine thermally oxidized insulating film and a thermally oxynitrided insulating film. Specifically, it conceptually includes a genuine thermally oxidized insulating film composed of an $Al_2O_3$ film and a thermally oxynitrided insulating film composed of an $AlON_x$ film containing nitrogen.

Embodiment 2

A semiconductor device according to a second embodiment of the present invention and a fabrication method therefor will be described herein below with reference to FIGS. 3A to 3D.

FIGS. 3A to 3D are cross-sectional views showing process steps in the method for fabricating the semiconductor device according to the second embodiment.

Figure 3A:
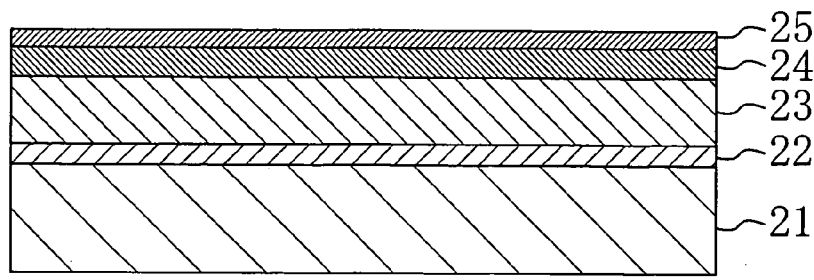
FIGS. 3A to 3D are cross-sectional views showing process steps in a method for fabricating a semiconductor device according to a second embodiment of the present invention.

First, as shown in FIG. 3A, a buffer layer 22 made of AlN is deposited on a SiC substrate 21 by MOCVD. Then, a GaN layer 23 with a film thickness of 1 μm is deposited on the buffer layer 22. Then, an $Al_{0.25}Ga_{0.75}N$ layer 24 with a film thickness of 25 nm is deposited as a surface barrier layer on the GaN layer 23. Subsequently, an AlN layer 25 with an extremely small film thickness of 1 nm is deposited by MOCVD on the $Al_{0.25}Ga_{0.75}N$ layer 24.

Figure 3B:
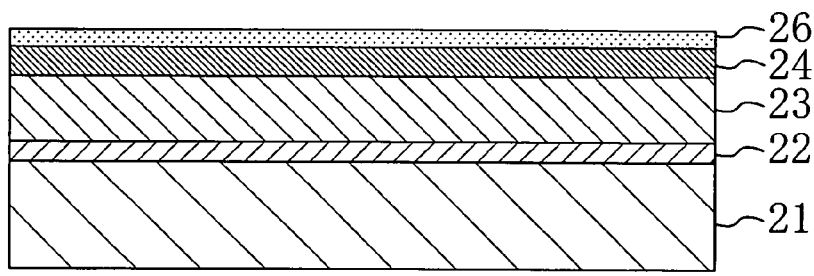

Next, as shown in FIG. 3B, a thermally oxidized insulating film is formed by oxidizing the surface of the sample shown in FIG. 3A in an oxygen atmosphere at 900° C. for 10 minutes, in which an oxygen flow rate is 5 mL/min (standard state). As a result, the AlN layer 25 formed on the outermost surface is thermally oxidized and changed into an $Al_2O_3$ film (thermally oxidized insulating film) 26 with a thickness of 1.3 nm.

Figure 3C:
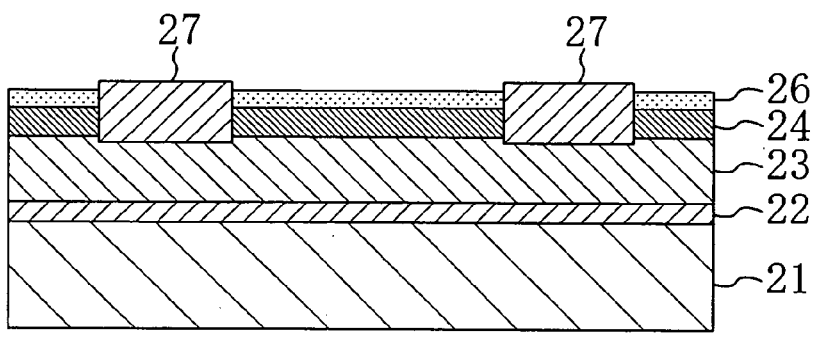

Next, as shown in FIG. 3C, etching is performed by using a resist pattern as a mask to remove a desired region of the $Al_2O_3$ film 26 or the like and form source/drain formation regions. Then, metal vapor deposition is performed, followed by a lift-off process performed with respect to the resist pattern. Further, annealing is performed with respect to source/drain regions on which the metal has been vapor deposited, thereby forming source/drain electrodes 27.

Figure 3D:
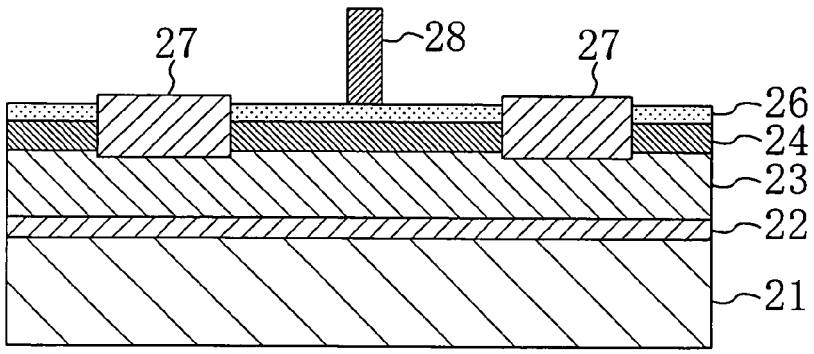

Next, as shown in FIG. 3D, Pd containing 5 wt % of Si as an adhesion enhancing element is vapor deposited on the $Al_2O_3$ film 26 and subjected to a lift-off process to form a gate electrode 28 composed of Pd containing 5 wt % of Si, whereby a transistor is completed.

The adhesion enhancing element is an element which enhances the adhesion of the gate electrode to the nitride semiconductor layer in the same manner as in the first embodiment. As shown above in Table 1, an element having high adhesion such as Ti, Si, Ni, Cr, or Cu can be used as the adhesion enhancing element.

Preferably, the adhesion enhancing element is a highly oxidizable element in the same manner as in the first embodiment. This is because a gate electrode containing a highly oxidizable element is excellent in the adhesion to the nitride semiconductor layer. Specifically, any of Al, Hf, Zr, Nb, Ta, Nd, Si, Ga, and In is used desirably as an adhesion enhancing element as shown above in Table 2.

Preferably, the $Al_2O_3$ film 26 formed between the gate electrode 28 and the $Al_{0.25}Ga_{0.75}N$ layer 24 has a thickness not less than 0.5 nm and not more than 3 nm in the same manner as in the first embodiment.

This is because the Schottky characteristic is good when the thickness of the $Al_2O_3$ film 26 is not less than 0.5 nm and not more than 3 nm, as is obvious from Table 3 shown above. That is, a leakage current cannot be suppressed if the film thickness is less than 0.5 nm in the same manner as in the case where the gate electrode 28 is bonded directly onto the GaN layer 23, while the $Al_2O_3$ film 26 develops the function as an insulating film if the thickness of the $Al_2O_3$ film 26 is larger than 3 nm and therefore a Schottky junction cannot be formed. In short, a good Schottky characteristic is achievable and the function of the gate electrode is not impaired if the thickness of the $Al_2O_3$ film 26 is not less than 0.5 nm and not more than 3 nm. It will also be understood that the surface morphology of the $Al_2O_3$ film 26 is also good if the thickness of the $Al_2O_3$ film 26 is not less than 0.5 nm and not more than 3 nm. However, the Schottky characteristic is better and a leakage current can be suppressed more effectively if the thickness of the $Al_2O_3$ film 26 is 0.8 nm to 3 nm, more preferably.

Thus, in the semiconductor device according to the second embodiment and the fabrication method therefor, the $Al_2O_3$ film 26 is interposed between the gate electrode 28 and the $Al_{0.25}Ga_{0.75}N$ layer 24 so that the gate electrode 28 undergoes a chemical reaction with the $Al_2O_3$ film 26 but does not undergo a direct chemical reaction with the $Al_{0.25}Ga_{0.75}N$ layer 24. Consequently, the occurrence of a leakage current is suppressed. Because the gate electrode 28 undergoes a chemical reaction with the $Al_2O_3$ film 26 but does not undergo a direct chemical reaction with the $Al_{0.25}Ga_{0.75}N$ layer 24, the content of Si mixed in the gate electrode 28 can be increased to a required value. This enhances the adhesion of the gate electrode to a nitride semiconductor layer and prevents the delamination of the gate electrode due to an external factor. As a result, the delamination of the gate electrode 28 was not observed at all even when excessive ultrasonic cleaning was performed during the lift-off process in the formation of the gate electrode 28. Thus, the semiconductor device according to the second embodiment and the fabrication method therefor realize an extremely low leakage current characteristic inherent in Pd composing the gate electrode 28 and prevents the delamination of the gate electrode 28.

Since the $Al_2O_3$ film 26 interposed between the gate electrode 28 and the $Al_{0.25}Ga_{0.75}N$ layer 24 is a thermally oxidized insulating film, a surface level resulting from a dangling bond or the like is low so that electric stability is obtainable in forming the thermally oxidized insulating film. Accordingly, the thermally oxidized insulating film interposed between the gate electrode 28 and the $Al_{0.25}Ga_{0.75}N$ layer 24 prevents a leakage current caused by the electrical activation of the majority of the surface level resulting from the dangling bond or the like provided that it is an insulating film deposited normally by CVD or the like.

Figure 4:
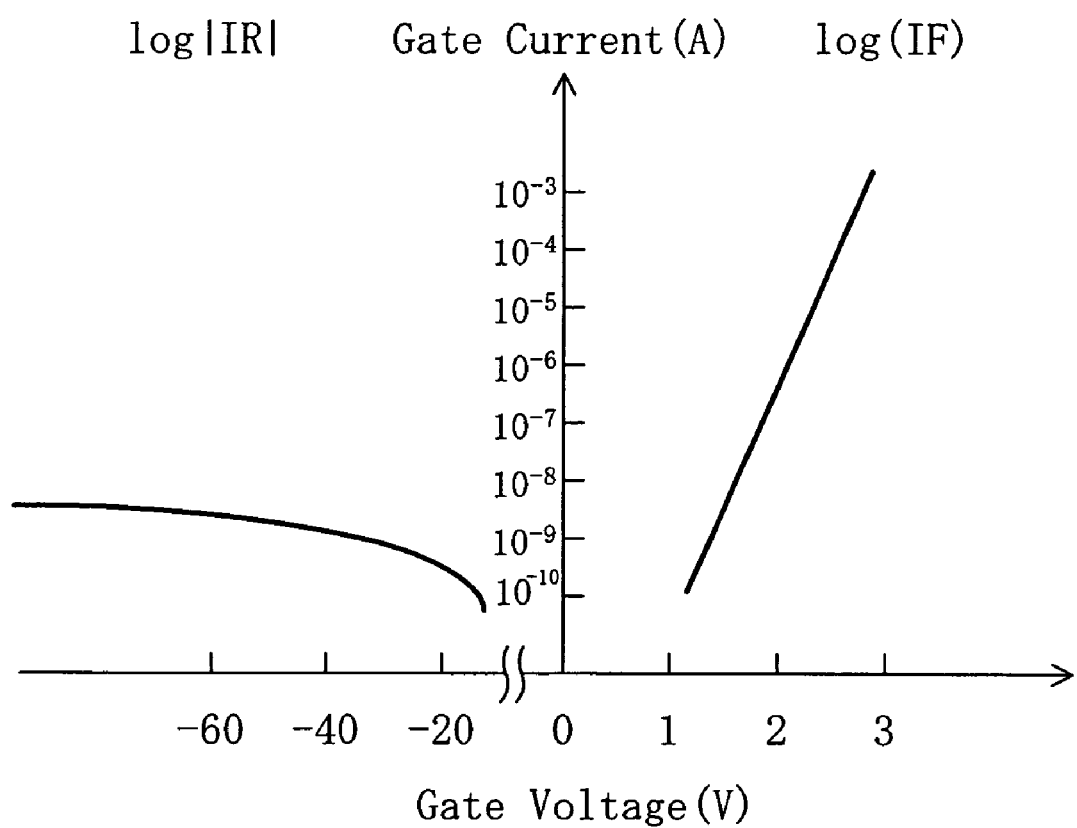
FIG. 4 is a graph showing the I-V characteristic of a gate electrode according to the second embodiment.

FIG. 4 shows the I-V characteristic of the gate electrode 28 according to the second embodiment. As is obvious from FIG. 4, the gate electrode 28 shows a characteristic such that a leakage current is 3 nA or less till a reverse bias reaches 50 V and the semiconductor device according to the second embodiment has an excellent Schottky characteristic.

It is to be noted that the thermally oxidized insulating film used in the second embodiment conceptually includes a genuine thermally oxidized insulating film and a thermally oxynitrided insulating film. Specifically, it conceptually includes a genuine thermally oxidized insulating film composed of an $Al_2O_3$ film and a thermally oxynitrided insulating film composed of an $AlON_x$ film containing nitrogen.

Embodiment 3

A semiconductor device according to a third embodiment of the present invention and a fabrication method therefor will be described herein below with reference to FIGS. 5A to 5C.

Figure 5A:
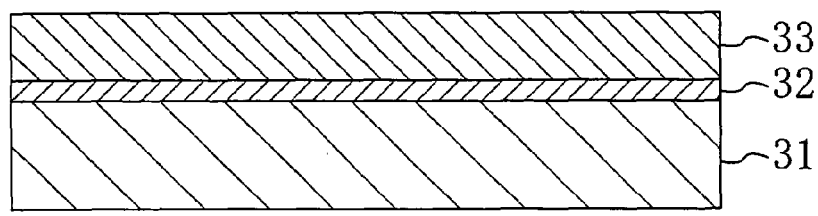
FIGS. 5A to 5C are cross-sectional views showing process steps in a method for fabricating a semiconductor device according to a third embodiment of the present invention.
Figure 5B:
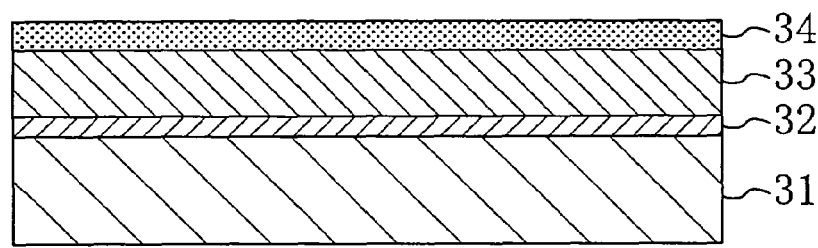
Figure 5C:
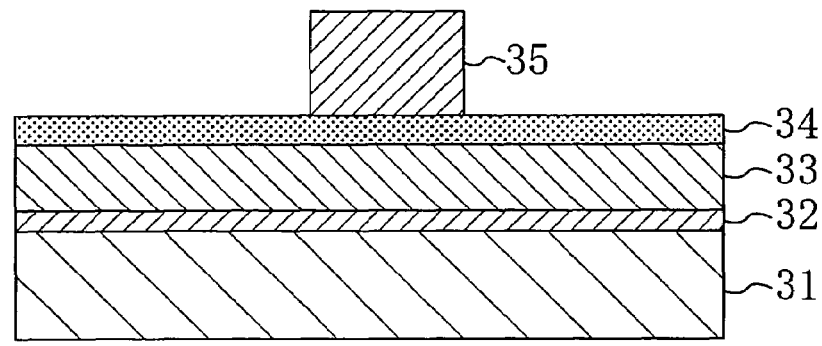

FIGS. 5A to 5C are cross-sectional views showing process steps in the method for fabricating the semiconductor device according to the third embodiment.

First, as shown in FIG. 5A, a buffer layer 32 having a film thickness of 50 nm is deposited on a SiC substrate 31. Then, an n⁻-type GaN layer 33 with a film thickness of 1 μm is deposited on the buffer layer 32.

Next, as shown in FIG. 5B, a thermally oxidized insulating film is formed by oxidizing the surface of a sample shown in FIG. 5A in an oxygen atmosphere at 900° C. for 3 minutes, in which an oxygen flow rate is 5 mL/min (standard state). As a result, the GaN layer 33 has an outermost surface thereof oxidized and changed into a $Ga_2O_3$ film (thermally oxidized insulating film) 34 with an extremely small thickness of 1.5 nm.

Next, as shown in FIG. 5C, Pd containing 5 wt % of Si as an adhesion enhancing element is vapor deposited on the $Ga_2O_3$ film 34 and subjected to a lift-off process to form a gate electrode 35 composed of Pd containing 5 wt % of Si, whereby a diode is completed.

The adhesion enhancing element is an element which enhances the adhesion of the gate electrode to the nitride semiconductor layer in the same manner as in the first embodiment. As shown above in Table 1, an element having high adhesion such as Ti, Si, Ni, Cr, or Cu can be used as the adhesion enhancing element.

Preferably, the adhesion enhancing element is a highly oxidizable element in the same manner as in the first embodiment. This is because a gate electrode containing a highly oxidizable element is excellent in the adhesion to the nitride semiconductor layer. Specifically, any of Al, Hf, Zr, Nb, Ta, Nd, Si, Ga, and In is used desirably as an adhesion enhancing element as shown above in Table 2.

A description will be given herein below to a relationship between the concentration (wt %) of Si in the metals composing the gate electrode 35 and each of the adhesion of the gate electrode 35 to the $Ga_2O_3$ film and the electric characteristics of the gate electrode 35 in the case of using Si as an adhesion enhancing element with reference to Table 4.

TABLE 4

| | Si Concentration (Wt %) | | | | | | | | | | |
|---|---|---|---|---|---|---|---|---|---|---|---|
| | 2 | 3 | 4 | 5 | 6 | 7 | 8 | 9 | 10 | 11 | 12 |
| Adhesion | Δ | ○ | ● | ● | ● | ● | ● | ● | ● | ● | ● |
| Electric Characteristics | Δ | ○ | ● | ● | ● | ● | ○ | ○ | ○ | Δ | Δ |

●: Excellent
○: Good
Δ: Acceptable

As shown in Table 4, the adhesion of the gate electrode 35 to the $Ga_2O_3$ film 34 is excellent provided that the weight percent of Si in the metals composing the gate electrode 35 is not less than 4% and less than 13% so that the delamination of the gate electrode is not observed at all throughout the entire surface of the wafer. If the weight percent of Si in the metals composing the gate electrode 35 is not less than 3% and less than 4%, the delamination of the gate electrode is seldom observed throughout the entire surface of the wafer. If the weight percent of Si in the metals composing the gate electrode 35 is not less than 2% and less than 3%, the delamination of the gate electrode 35 is observed at points over the entire surface of the wafer.

A leakage current serving as an index for evaluating the electric characteristics of the gate electrode 35 relative to the $Ga_2O_3$ film 34 is extremely small if the weight percent of Si in the metals composing the gate electrode 35 is in a range not less than 4% and less than 8%. If the weight percent of Si in the metals composing the gate electrode 35 is in a range not less than 3% and less than 4% or in a range not less than 8% and less than 11%, a leakage current is small. If the weight percent of Si in the metals composing the gate electrode 35 is in a range not less than 2% and less than 3% or in a range not less than 8% and less than 11%, a leakage current is slightly higher but the semiconductor device is usable depending on an application.

If Si is used as an adhesion enhancing element, therefore, the weight percent of Si in the metals composing the gate electrode 35 is preferably not less than 3% and not more than 10%. In the arrangement, the delamination of the gate electrode 35 is not observed at all or seldom observed throughout the entire surface of the wafer so that the gate electrode 35 has an excellent adhesion to the $Ga_2O_3$ film 34. In this case, it is also possible to suppress the leakage current to an extremely small value or to a small value so that the gate electrode 35 has excellent electric characteristics.

More preferably, the weight percent of Si in the metals composing the gate electrode 35 is not less than 4% and not more than 7%. In the arrangement, the delamination of the gate electrode 35 is not observed at all throughout the entire surface of the wafer so that the gate electrode 35 has an extremely excellent adhesion to the $Ga_2O_3$ film 34. In this case, it is also possible to suppress the leakage current to an extremely small value so that the gate electrode 35 has extremely excellent electric characteristics.

Although Table 4 shown above shows the relationship between the concentration (wt %) of Si in the metals composing the gate electrode 35 and each of the adhesion of the gate electrode 35 to the $Ga_2O_3$ film 34 and the electric characteristics of the gate electrode 35 when Si is used as an adhesion enhancing element, it is obvious that a similar relationship is obtainable even in the case of using a thermally oxidized insulating film represented by an oxide of any of the highly oxidizable elements in Table 2 or the like.

Thus, in the semiconductor device according to the third embodiment and the fabrication method therefor, the $Ga_2O_3$ film 34 is interposed between the gate electrode 35 and the GaN layer 33 so that the gate electrode 35 undergoes a chemical reaction with the $Ga_2O_3$ film 34 but does not undergo a direct chemical reaction with the GaN layer 33. Consequently, the occurrence of a leakage current is suppressed. Because the gate electrode 35 undergoes a chemical reaction with the $Ga_2O_3$ film 34 but does not undergo a direct chemical reaction with the GaN layer 33, the content of Si mixed in the gate electrode 35 can be increased to a required value. This enhances the adhesion of the gate electrode to the nitride semiconductor layer and prevents the delamination of the gate electrode 35 due to an external factor. As a result, the delamination of the gate electrode 35 was not observed at all even when excessive ultrasonic cleaning was performed during the lift-off process in the formation of the gate electrode 35. Thus, the semiconductor device according to the third embodiment and the fabrication method therefor realize an extremely low leakage characteristic inherent in Pd composing the gate electrode 35 and prevent the delamination of the gate electrode 35.

It is to be noted that the thermally oxidized insulating film used in the third embodiment conceptually includes a genuine thermally oxidized insulating film and a thermally oxynitrided insulating film. Specifically, it conceptually includes a genuine thermally oxidized insulating film composed of a $Ga_2O_3$ film and a thermally oxynitrided insulating film composed of a $GaON_x$ film containing nitrogen.

Embodiment 4

A semiconductor device according to a fourth embodiment of the present invention and a fabrication method therefor will be described herein below with reference to FIGS. 6A to 6D and FIG. 7.

FIGS. 6A to 6D are cross-sectional views showing process steps in the method for fabricating the semiconductor device according to the fourth embodiment.

Figure 6A:
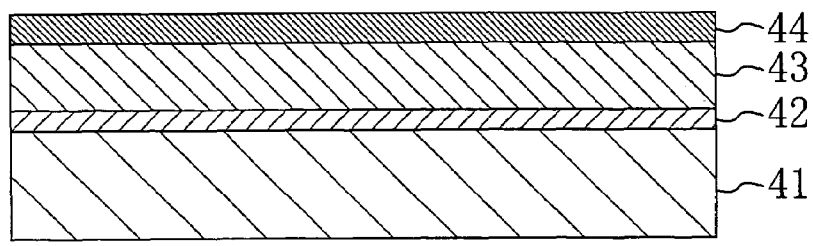
FIGS. 6A to 6D are cross-sectional views showing process steps in a method for fabricating a semiconductor device according to a fourth embodiment of the present invention.

First, as shown in FIG. 6A, a buffer layer 42 having a film thickness of 50 nm is formed by MOCVD on a SiC substrate 41. Then, a non-doped GaN layer 43 with a film thickness of 2 μm is deposited on the buffer layer 42. An $Al_{0.25}Ga_{0.75}N$ layer 44 with a film thickness of 20 nm is deposited as a surface barrier layer on the GaN layer 43. The $Al_{0.25}Ga_{0.75}N$ layer 44 has been doped with Si, similarly to an AlGaAs/GaAs modulation-doped structure used normally for a HFET.

Figure 6B:
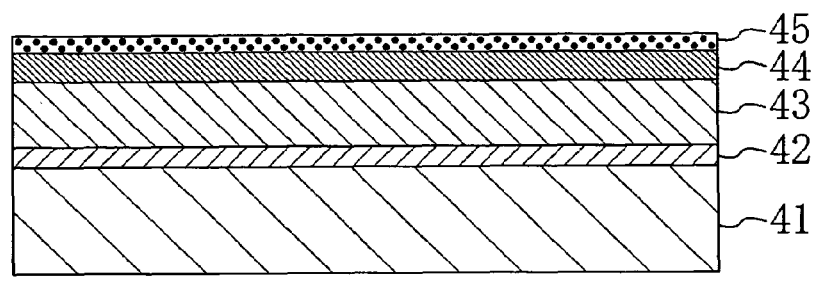

Next, as shown in FIG. 6B, five to seven atomic layers of Si used as a dopant are stacked on the $Al_{0.25}Ga_{0.75}N$ layer 44 to form an Si layer 45. Such an Si layer 45 having an extremely small film thickness can be formed by MOCVD.

Next, the two to three atomic layers on the outermost surface of the Si layer 45 that have been naturally oxidized while the semiconductor device is moved in an atmosphere are removed by using HF.

Figure 6C:
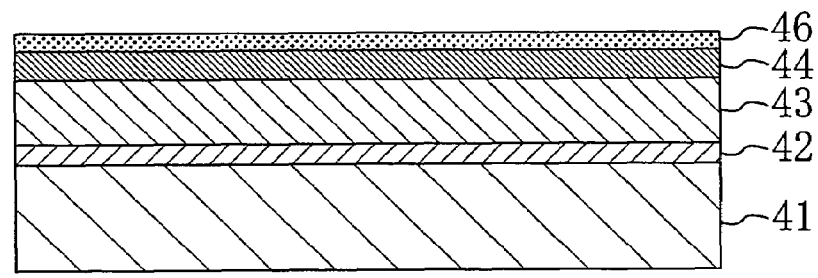

Next, as shown in FIG. 6C, a heat treatment is performed with respect to the sample shown in FIG. 6B in an atmosphere containing 20% of oxygen (oxygen flow rate is 5 mL/min (standard state)) and 80% of nitrogen at 750° C. for 10 minutes in an oxidation furnace, whereby a thermally oxidized insulating film is formed. In this case, since the oxidation temperature is 750° C. and extremely low, only the Si layer 45 is oxidized into an extremely thin $SiO_2$ film (thermally oxidized insulating film) 46 having a thickness of 1 nm, while the $Al_{0.25}Ga_{0.75}N$ layer 44 is not oxidized.

Figure 6D:
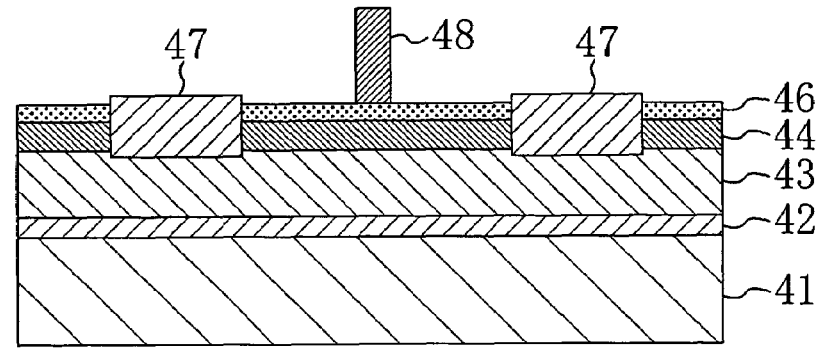

Next, as shown in FIG. 6D, etching is performed with respect to the $SiO_2$ film 46 and the like by using a resist pattern as a mask, thereby removing a desired region of the $SiO_2$ film 46 or the like and forming source/drain formation regions. Then, a metal is deposited on the source/drain formation regions, the resist pattern is lifted off, and annealing is performed with respect to source/drain regions, whereby source/drain electrodes 47 are formed.

Next, Pd containing 30 wt % of Si as an adhesion enhancing element is vapor deposited on the $SiO_2$ film 46 and subjected to a lift-off process to form a gate electrode 48 composed of Pd containing 30 wt % of Si, whereby a transistor is completed.

The adhesion enhancing element is an element which enhances the adhesion of the gate electrode to the nitride semiconductor layer in the same manner as in the first embodiment. As shown above in Table 1, an element having high adhesion such as Ti, Si, Ni, Cr, or Cu can be used as the adhesion enhancing element.

Preferably, the adhesion enhancing element is a highly oxidizable element in the same manner as in the first embodiment. This is because a gate electrode containing a highly oxidizable element is excellent in the adhesion to the nitride semiconductor layer. Specifically, any of Al, Hf, Zr, Nb, Ta, Nd, Si, Ga, and In is used desirably as an adhesion enhancing element as shown above in Table 2.

Preferably, the $SiO_2$ film 46 formed between the gate electrode 48 and the $Al_{0.25}Ga_{0.75}N$ layer 44 has a thickness not less than 0.5 nm and not more than 3 nm in the same manner as in the first embodiment.

Table 5 shows a relationship between the thickness of the $SiO_2$ film 46 and each of the Schottky characteristic of the gate electrode 48 formed on the $SiO_2$ film 46 and the surface morphology of the $SiO_2$ film 46.

TABLE 5

|  | Thickness of $SiO_2$ Film (nm) | | | | | | |
| --- | --- | --- | --- | --- | --- | --- | --- |
|  | 0.2 | 0.5 | 1.0 | 1.5 | 2.0 | 2.5 | 3.0 |
| Schottky Characteristic | — | ○ | ○ | ○ | ○ | ○ | Δ |
| Surface Morphology of $SiO_2$ Film | — | ○ | ○ | ○ | ○ | ○ | Δ |

○: Good
Δ: Acceptable

As is obvious from Table 5, the Schottky characteristic is good when the thickness of the $SiO_2$ film 46 is not less than 0.5 nm and not more than 3 nm. This is because, if the film thickness is less than 0.5 nm, a leakage current cannot be suppressed in the same manner as in the case where a gate electrode 48 is bonded directly onto the $Al_{0.25}Ga_{0.75}N$ layer 44, while the $SiO_2$ film 46 develops the function as the insulating film and a Schottky junction cannot be formed when the film thickness is larger than 3 nm. In short, a good Schottky characteristic is realized and the function of the gate electrode is not impaired if the thickness of the $SiO_2$ film 46 is not less than 0.5 nm and not more than 3 nm. It will also be understood that the surface morphology of the $SiO_2$ film 46 is also good if the thickness of the $SiO_2$ film 46 is not less than 0.5 nm and not more than 3 nm. However, the Schottky characteristic is better and a leakage current is suppressed more effectively if the thickness of the $SiO_2$ film 46 is 0.5 nm to 1.5 nm, more preferably.

Thus, in the semiconductor device according to the fourth embodiment and the fabrication method therefor, the $SiO_2$ film 46 is interposed between the gate electrode 48 and the $Al_{0.25}Ga_{0.75}N$ layer 44 so that the gate electrode 48 undergoes a chemical reaction with the $SiO_2$ film 46 but does not undergo a direct chemical reaction with the $Al_{0.25}Ga_{0.75}N$ layer 44. Consequently, the occurrence of a leakage current is suppressed. Because the gate electrode 48 undergoes a chemical reaction with the $SiO_2$ film 46 but does not undergo a direct chemical reaction with the $Al_{0.25}Ga_{0.75}N$ layer 44, the content of Si mixed in the gate electrode 48 can be increased to a required value. This enhances the adhesion of the gate electrode to the nitride semiconductor layer and prevents the delamination of the gate electrode due to an external factor. As a result, the delamination of the gate electrode 48 was not observed at all even when excessive ultrasonic cleaning was performed during the lift-off process in the formation of the gate electrode 48. Thus, the semiconductor device according to the fourth embodiment and the fabrication method therefor realize an extremely low leakage characteristic inherent in Pd composing the gate electrode 48 and prevent the delamination of the gate electrode 48.

Since the $SiO_2$ film 46 interposed between the gate electrode 48 and the $Al_{0.25}Ga_{0.75}N$ layer 44 is a thermally oxidized insulating film, a surface level resulting from a dangling bond or the like is low so that electric stability is obtainable in forming the thermally oxidized insulating film. Accordingly, the thermally oxidized insulating film interposed between the gate electrode 48 and the $Al_{0.25}Ga_{0.75}N$ layer 44 prevents a leakage current caused by the electrical activation of the majority of the surface level resulting from the dangling bond or the like provided that it is an insulating film deposited normally by CVD or the like.

It is to be noted that the thermally oxidized insulating film used in the fourth embodiment conceptually includes a genuine thermally oxidized insulating film and a thermally oxynitrided insulating film. Specifically, it conceptually includes a genuine thermally oxidized insulating film composed of an $SiO_2$ film and a thermally oxynitrided insulating film composed of an $SiON_x$ film containing nitrogen.

Although the fourth embodiment has formed the Si layer 45 through doping, it is also possible to vapor deposit an Si layer.

Although the description has been given to the case where the $Al_{0.25}Ga_{0.75}N$ layer 44 is doped with Si, the same effects are achievable if it is not doped with Si.

A description will be given herein to a semiconductor device according to a variation of the fourth embodiment with reference to FIG. 7.

Figure 7:
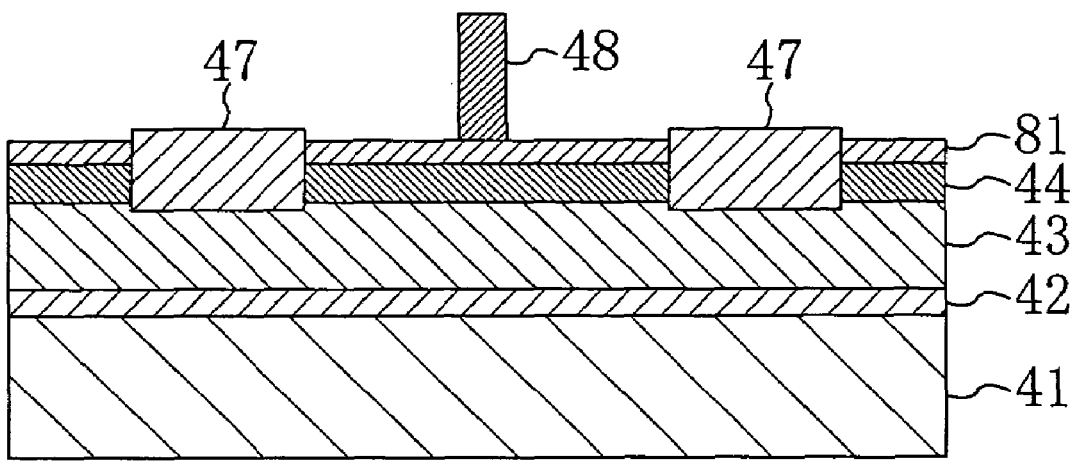
FIG. 7 is a cross-sectional view showing a structure of a semiconductor device according to a variation of the fourth embodiment.

FIG. 7 is a cross-sectional view showing a structure of the semiconductor device according to the variation of the fourth embodiment.

In the semiconductor device shown in FIG. 7, the SiC substrate 41, the buffer layer 42, the GaN layer 43, and the $Al_{0.25}Ga_{0.75}N$ layer 44 have been formed in the same manner as described above with reference to FIG. 6A. An SiON layer 81 on the $Al_{0.25}Ga_{0.75}N$ layer 44 has been formed by performing a heat treatment in an $N_2O$ or NO atmosphere with respect to the Si layer 45 formed by the procedure described with reference to FIG. 6B and thereby changing the outermost surface of the Si layer 45 into an extremely thin silicon oxynitride film. The source/drain electrodes 47 and the gate electrode 48 are formed by the same procedure as described above with reference to FIG. 6D. In this manner, a transistor is completed.

Thus, in the semiconductor device according to the variation of the fourth embodiment and the fabrication method therefor, the SiON film 81 is interposed between the gate electrode 48 and the $Al_{0.25}Ga_{0.75}N$ layer 44 so that the gate electrode 48 undergoes a chemical reaction with the SiON film 81 but does not undergo a direct chemical reaction with the $Al_{0.25}Ga_{0.75}N$ layer 44. Consequently, the occurrence of a leakage current is suppressed. Because the gate electrode 48 undergoes a chemical reaction with the SiON film 81 but does not undergo a direct chemical reaction with the $Al_{0.25}Ga_{0.75}N$ layer 44, the content of Si mixed in the gate electrode 48 can be increased to a required value. This enhances the adhesion of the gate electrode to the nitride semiconductor layer and prevents the delamination of the gate electrode due to an external factor. As a result, the delamination of the gate electrode 48 was not observed at all even when excessive ultrasonic cleaning was performed during the lift-off process in the formation of the gate electrode 48. Thus, the semiconductor device according to the variation of the fourth embodiment and the fabrication method therefor realize an extremely low leakage characteristic inherent in Pd composing the gate electrode 48 and prevent the delamination of the gate electrode 48.

By thus using the thermally oxynitrided insulating film composed of the $SiON_x$ film containing nitrogen as the thermally oxidized insulating film also, the same effects as achieved in the case where the foregoing genuine thermally oxynitrided insulating film is used are achievable.

Although each of the foregoing first to fourth embodiments has described the case where the $Al_2O_3$ film, the $Ga_2O_3$ film, or the $SiO_2$ film is used as the thermally oxidized insulating film, the same effects as achieved in the case where the thermally oxidized insulating film is the $Al_2O_3$ film, the $Ga_2O_3$ film, or the $SiO_2$ film are achievable even when the $HfO_2$ film, the $ZrO_2$ film, the $Nb_2O_5$ film, the $Ta_2O_5$ film, the $Nd_2O_3$ film, or the $In_2O_3$ film of the oxides shown above in Table 2 is used.

Although each of the foregoing first to fourth embodiments has described the case where SiC is used for the substrate, the present invention is not limited thereto. It is also possible to use sapphire, Si, GaN, or the like instead of SiC.

Although each of the first to fourth embodiments has described the case where the film underlying the thermally oxidized insulating film is the GaN film or the AlGaN film, the same effects are achievable if the thermally oxidized insulating film described in any of the first to fourth embodiments is formed on a Group III nitride semiconductor layer typically represented by $(In_xAl_{1-x})_yGa_{1-y}N$ ($0 \le x \le 1$, $0 \le y \le 1$) such as an AlN film, an InN film, or a film made of a mixed crystal thereof.

Consideration of Function and Effect of the Present Invention

A description will be given to the fact that, even in the case where an insulating film is interposed between the gate metal electrode and the nitride semiconductor layer as described in each of the embodiments, the gate electrode according to each of the foregoing embodiments has the same Schottky characteristic as obtained in the case where a metal is deposited directly on the surface of the nitride semiconductor layer by retaining the thickness of the insulating film at about 1 nm to 3 nm.

Figure 8A:
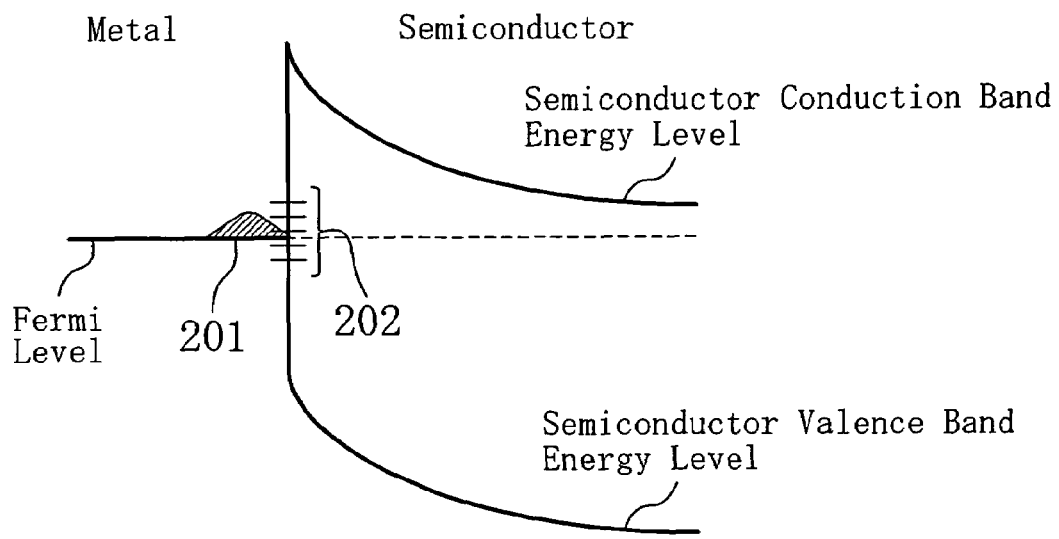
FIG. 8A is a band diagram of a Schottky junction obtained by forming a metal electrode directly on the surface of a nitride semiconductor layer and FIG. 8B is a view showing an I-V characteristic.

FIG. 8A is a band diagram of a Schottky junction formed between a metal electrode and the surface of a nitride semiconductor layer on which the metal electrode is formed directly.

Figure 8B:
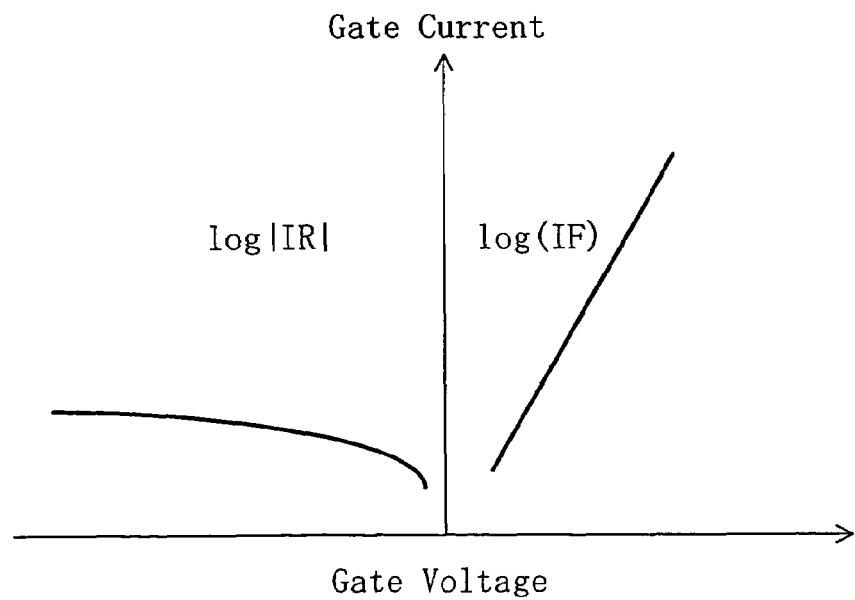

As shown in FIG. 8A, alignment between the Fermi level of a metal which determines the height of a Schottky barrier and that of a nitride semiconductor layer is provided by overlapping between the wave function 201 of an electron in the vicinity of the Fermi level of the metal and an interface level 202 at the interface between the nitride semiconductor layer and the metal. The I-V characteristic at the junction is given by the following equation which proximately follows a thermal electron emission model, as shown in FIG. 8B:

$$J = A^{**}T^2(-q\phi/k_BT)\{\exp(qV/k_BT) - 1\}$$

where J represents a current density, $A^{**}$ represents a Richardson constant, q represents an elementary charge, $\phi$ represents the height of a Schottky barrier, $k_BT$ represents a Boltzmann constant, T represents an absolute temperature, and V represents an applied voltage.

Figure 9:
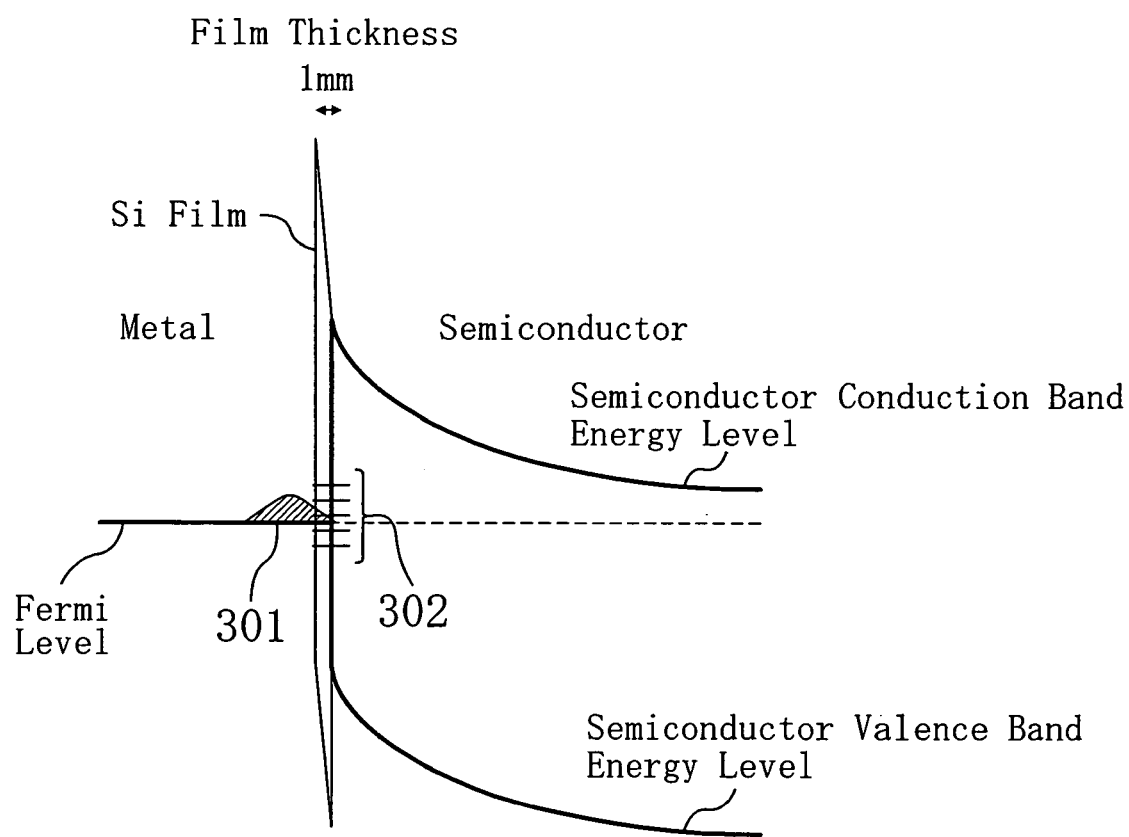
FIG. 9 is a band diagram when an extremely thin insulating film is interposed between the metal electrode and the nitride semiconductor layer.
Figure 10:
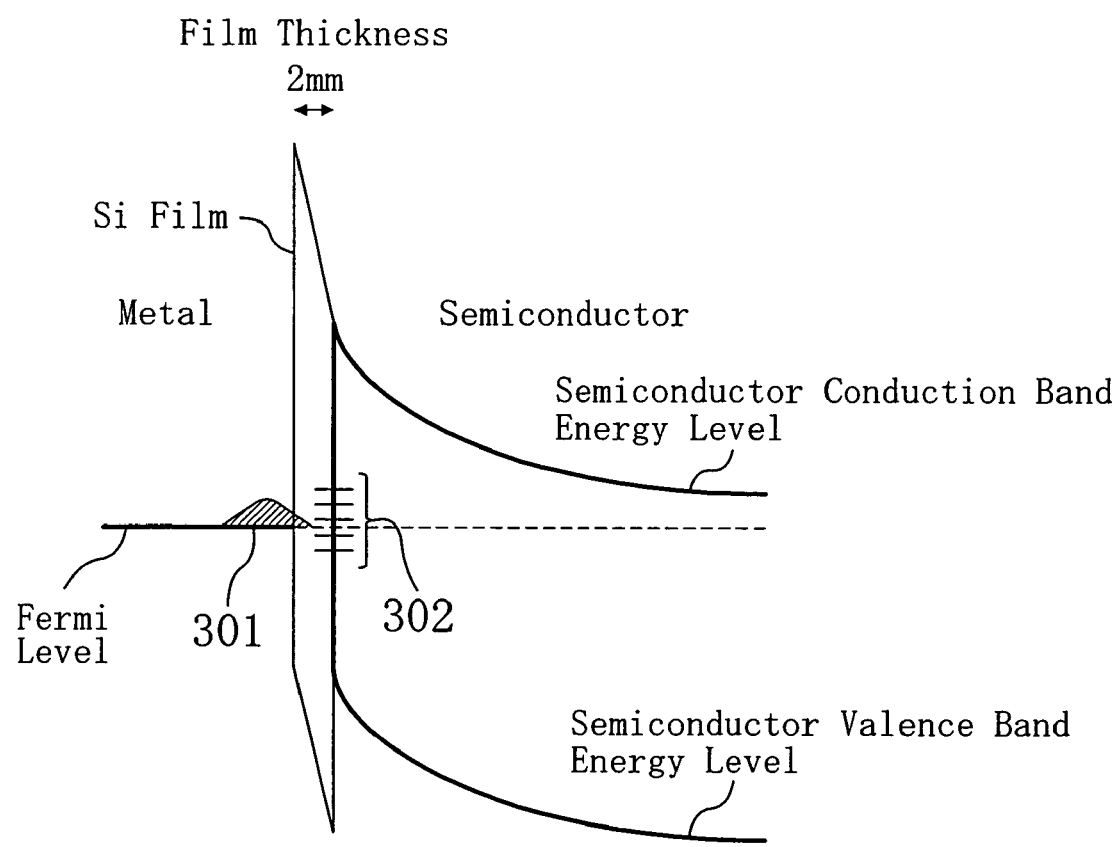
FIG. 10 is a band diagram when an extremely thin insulating film is interposed between the metal electrode and the nitride semiconductor layer.
Figure 11:
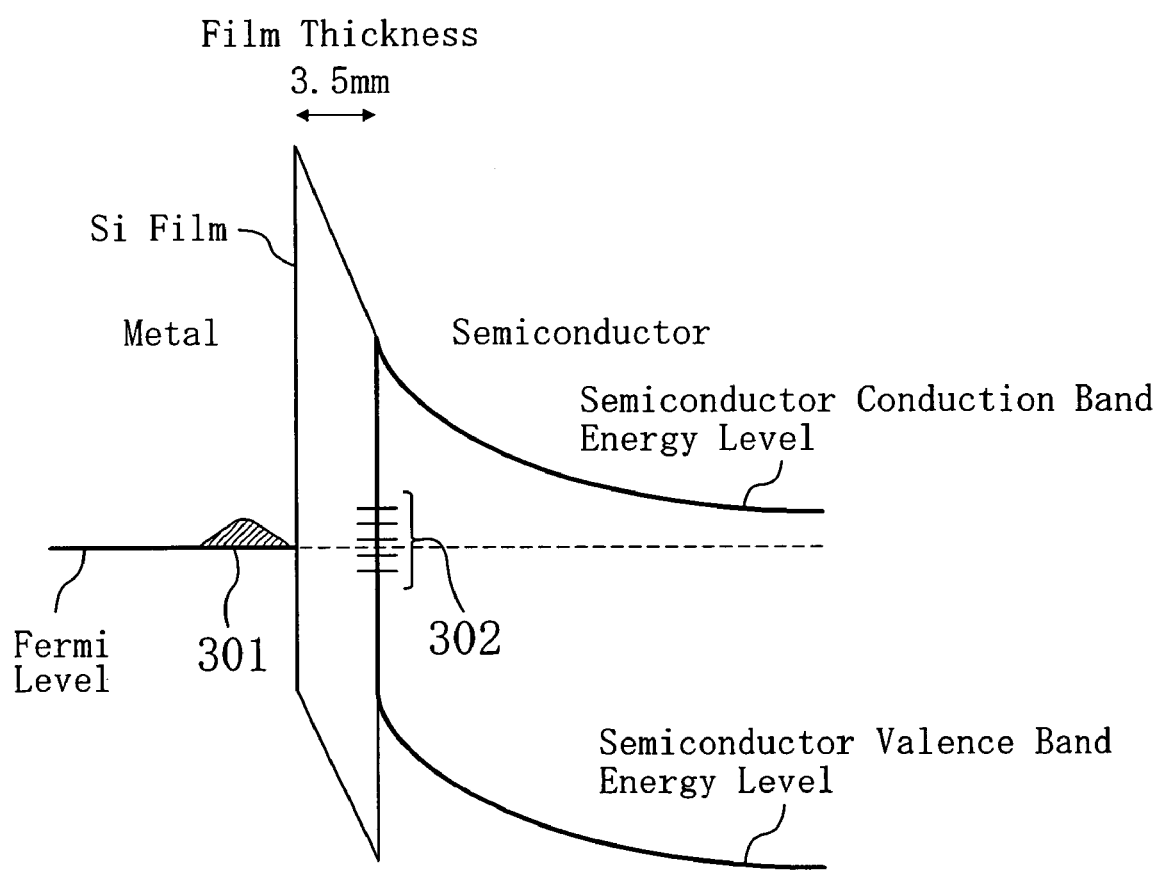
FIG. 11 is a band diagram when an extremely thin insulating film is interposed between the metal electrode and the nitride semiconductor layer.

FIGS. 9 to 11 are band diagrams when an extremely thin insulating film is interposed between the metal electrode and the nitride semiconductor layer.

As shown in FIGS. 9 to 11, if the thickness of the insulating film has gradually increased, the degree of overlapping between the wave function 301 of an electron in the vicinity of the Fermi level of the metal and the surface level 302 of the nitride semiconductor layer decreases gradually as the thickness of the insulating film has increased and eventually a non-related state (decoupling) is observed therebetween. In the case where the thickness of the insulating film is 3 nm or less and extremely small, the degree of overlapping between the wave function 301 and the surface level 302 of the nitride semiconductor 302 is sufficiently high and the same alignment as that provided in the case of a Schottky junction formed by depositing the metal directly on the nitride semiconductor layer is provided between the Fermi level of the metal and that of the semiconductor surface, while substantially the same I-V characteristic is obtained correspondingly.

Figure 12:
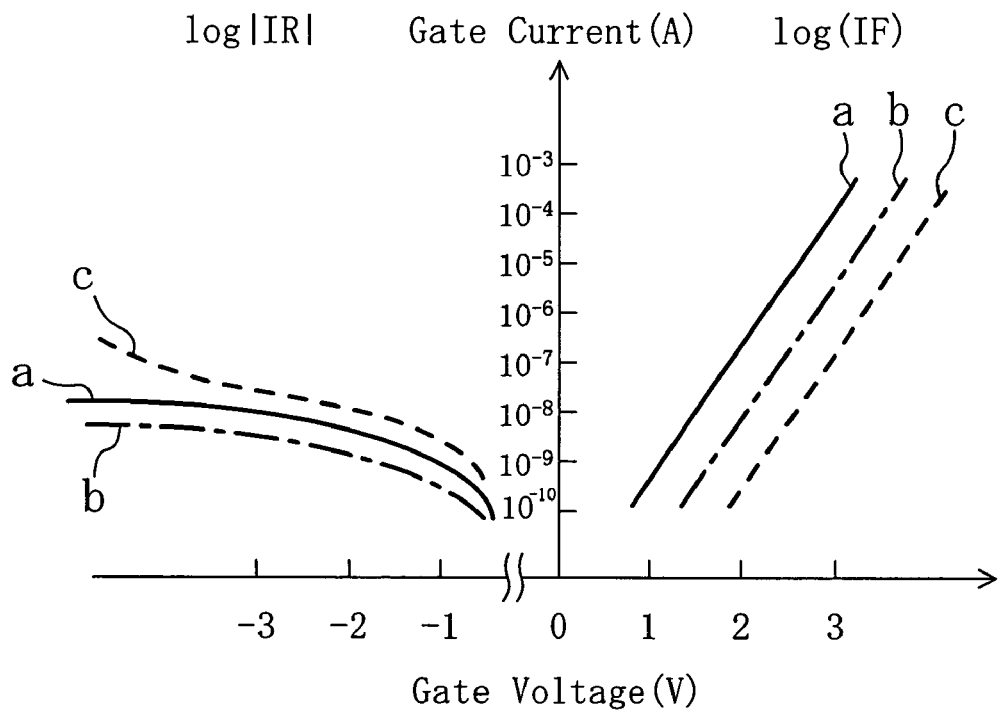
FIG. 12 is a view showing an I-V characteristic when an extremely thin insulating film is interposed between the metal electrode and the nitride semiconductor layer.
Figure 13:
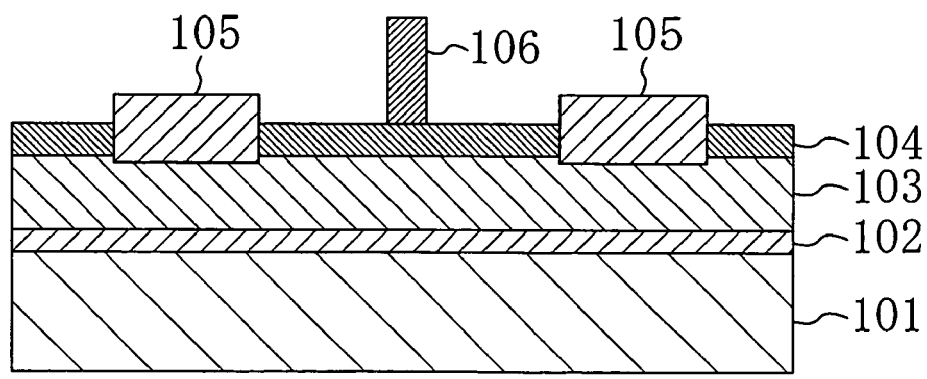
FIG. 13 is a cross-sectional view showing a structure of a conventional semiconductor device.

FIG. 12 shows the I-V characteristic corresponding to FIGS. 9 to 11 by using the curves a to c.

If the thickness of the insulating film is over 3 nm, the respective Fermi levels of the metal and the nitride semiconductor layer are in a non-related state, as indicated by the curve c, and form a tunnel junction instead of a Schottky junction. In this region, it becomes possible to control the Fermi level of the metal independently of that of the nitride semiconductor layer by adjusting the voltage applied to the gate electrode. At the time of reverse biasing, in particular, electrons injected from the gate by tunneling cause an increase in leakage current. In addition, a voltage drop in the insulating film also increases as the thickness of the insulating film has increased so that the controllability of an amount of charge in the nitride semiconductor layer deteriorates and a transconductance (gm) lowers in, e.g., a HFET.

By contrast, if the thickness of the insulating film is extremely small on the order of that of one or two atomic layers, the surface level of the nitride semiconductor layer increases due to the non-uniformity of the insulating film and the Schottky characteristic incurs an adverse effect such as an increased leakage current (see, for reference, E. H. RHODERICK and R. H. WILLIAM, "Metal-Semiconductor Contacts", 2nd Ed. Claredon Press. Oxford, 1988, Chapters 1 to 3").

If an $Al_2O_3$ film or an $SiO_2$ film is used as the insulating film, the adhesion of Pd is enhanced because the foregoing element Ti, Ni, or Si is extremely reactive. However, more desired electric characteristics are obtainable from Si than from Ti and Ni which may be diffused excessively into the insulating film during the reaction. If a gate electrode material containing Pd as a main component with a proper amount of Si mixed therein is used, it becomes possible to form a gate electrode exhibiting extremely high adhesion to the $Al_2O_3$ film or the $SiO_2$ film, while making full use of a low leakage characteristic inherent in Pd. The foregoing material combination is particularly desirable also in the present invention.

Thus, since the thermally oxidized insulating film is interposed between the gate electrode and the Group III nitride semiconductor layer according to the present invention, the occurrence of a leakage current can be suppressed and the adhesion of the gate electrode to the nitride semiconductor layer can be enhanced, which is useful in the case of forming a gate electrode on a Group III nitride semiconductor layer.

What is claimed is:

1. A method for fabricating a semiconductor device, the method comprising the steps of:

thermally oxidizing a Group III nitride semiconductor layer to form a thermally oxidized insulating film on a surface of the Group III nitride semiconductor layer; and forming a gate electrode with Schottky characteristic containing an adhesion enhancing element and an element other than the adhesion enhancing element on the thermally oxidized insulating film, wherein the adhesion enhancing element is Si and a weight percent of the Si in metals composing the gate electrode is not less than 3% and not more than 10%.

2. The method of claim 1, wherein the step of forming the thermally oxidized insulating film includes the step of:

forming an aluminum nitride layer on the Group III nitride semiconductor layer and then thermally oxidizing the aluminum nitride layer to change the aluminum nitride layer into an aluminum oxide layer and thereby form the thermally oxidized insulating film composed of the aluminum oxide layer.

3. The method of claim 2, wherein the aluminum oxide layer has a thickness not less than 0.5 nm and not more than 3 nm.

4. The method of claim 1, wherein the step of forming the thermally oxidized insulating film includes the step of:

forming a silicon layer on the surface of the Group III nitride semiconductor layer and then thermally oxidizing the silicon layer to change the silicon layer into a silicon oxide layer and thereby form the thermally oxidized insulating film composed of the silicon oxide layer.

5. The method of claim 4, wherein the silicon oxide layer has a thickness not less than 0.5 nm and not more than 3 nm.

6. A method for fabricating a semiconductor device, the method comprising the steps of:

thermally oxidizing a Group III nitride semiconductor layer to form a thermally oxidized insulating film on a surface of the Group III nitride semiconductor layer; and forming a gate electrode with Schottky characteristic containing an adhesion enhancing element and an element other than the adhesion enhancing element on the thermally oxidized insulating film, wherein the adhesion enhancing element is Si and a weight percent of the Si in metals composing the gate electrode is not less than 4% and not more than 7%.

7. The method of claim 6, wherein the step of forming the thermally oxidized insulating film includes the step of:

forming an aluminum nitride layer on the Group III nitride semiconductor layer and then thermally oxidizing the aluminum nitride layer to change the aluminum nitride layer into an aluminum oxide layer and thereby form the thermally oxidized insulating film composed of the aluminum oxide layer.

8. The method of claim 7, wherein the aluminum oxide layer has a thickness not less than 0.5 nm and not more than 3 nm.

* * * * *